US009233517B2

(12) United States Patent
Kato et al.

(10) Patent No.: US 9,233,517 B2
(45) Date of Patent: Jan. 12, 2016

(54) ELECTROMAGNETIC SHIELDING SHEET (75) Inventors: Kazufumi Kato, Tokyo (JP); Kazuaki Shikata, Tokyo (JP); Rumina Obi, Tokyo (JP); Ikuo Ueno, Tokyo (JP)

(73) Assignee: ASAHI KASEI FIBERS CORPORATION, Osaka-Shi (JP)

( * ) Notice: Subject to any disclaimer, the term of this patent is extended or adjusted under 35 U.S.C. 154(b) by 613 days.

(21) Appl. No.: 13/384,874

(22) PCT Filed: Jul. 22, 2010

(86) PCT No.: PCT/JP2010/062359
§ 371 (c)(1),
(2), (4) Date: Jan. 19, 2012

(87) PCT Pub. No.: WO2011/010697
PCT Pub. Date: Jan. 27, 2011

(65) Prior Publication Data
US 2012/0111627 A1 May 10, 2012

(30) Foreign Application Priority Data

Jul. 24, 2009 (JP) ................................ 2009-172983

(51) Int. Cl.
*B32B 5/26* (2006.01)
*B32B 5/02* (2006.01)
(Continued)

(52) U.S. Cl.
CPC . *B32B 5/022* (2013.01); *B32B 5/26* (2013.01); *D04H 3/14* (2013.01); *D04H 5/06* (2013.01);
(Continued)

(58) Field of Classification Search
CPC . D06M 11/83; D06M 17/00; D06M 2101/32; B32B 5/022; B32B 9/047; B32B 9/041; B32B 7/00; B32B 15/14; B32B 2250/20; B32B 2250/40; B32B 2255/02; B32B 2250/205; B32B 2262/0284; B32B 2305/20; B32B 2305/28; B32B 2307/202; B32B 2307/718; B32B 2457/00; D04H 3/14–3/153
USPC ......................................... 442/382, 376, 377
See application file for complete search history.

(56) References Cited

U.S. PATENT DOCUMENTS 4,865,892 A * 9/1989 Winfield et al. ............. 428/34.9
4,943,477 A * 7/1990 Kanamura et al. ............ 442/337
(Continued)

FOREIGN PATENT DOCUMENTS

EP 1 978 798 A1 10/2008
JP 2-82696 2/1990
(Continued)

OTHER PUBLICATIONS

Taiwan Patent Office, "Office Action," dated January 25, 2013, Application No. 099124388, 5 pages.
(Continued)

*Primary Examiner* — Jennifer A Steele
(74) *Attorney, Agent, or Firm* — Finnegan, Henderson, Farabow, Garrett & Dunner, L.L.P.

(57) ABSTRACT

Disclosed is an electromagnetic shielding sheet that has a smaller increase in the thickness of a base after the formation of a metal coating film when compared with conventional electromagnetic shielding sheets, and which has excellent electromagnetic wave shielding properties despite a small amount of adhered metal. According to the present invention, the electromagnetic shielding sheet can endure metal working processes and has high electromagnetic wave shielding properties, resulting in a thin, very flexible fabric sheet. Specifically disclosed is an electromagnetic shielding sheet which is composed of a laminated non-woven fabric that has at least a first layer and a second layer, and which is characterized in that the first layer is a layer of thermoplastic synthetic fibers having a fiber diameter of 6 μm to 50 μm, the second layer is a layer of ultrafine fibers having a fiber diameter of 0.1 μm to 5.0 μm, and a metal is adhered to at least one surface of the sheet.

7 Claims, 2 Drawing Sheets

(51) Int. Cl.
*D06M 11/83* (2006.01)
*D04H 3/14* (2012.01)
*H05K 9/00* (2006.01)
*D06M 17/00* (2006.01)
*D04H 5/06* (2006.01)
*D06M 101/32* (2006.01)

(52) U.S. Cl.
CPC .............. *D06M 11/83* (2013.01); *D06M 17/00* (2013.01); *H05K 9/0084* (2013.01); *B32B 2250/02* (2013.01); *B32B 2250/03* (2013.01); *B32B 2250/20* (2013.01); *B32B 2250/40* (2013.01); *B32B 2255/02* (2013.01); *B32B 2255/205* (2013.01); *B32B 2262/0284* (2013.01); *B32B 2305/20* (2013.01); *B32B 2305/28* (2013.01); *B32B 2307/202* (2013.01); *B32B 2307/718* (2013.01); *B32B 2457/00* (2013.01); *D06M 2101/32* (2013.01); *Y10T 442/657* (2015.04); *Y10T 442/659* (2015.04)

(56) References Cited

U.S. PATENT DOCUMENTS

| | | | |
|---|---|---|---|
| 2002/0106959 A1* | 8/2002 | Huffines et al. | 442/394 |
| 2003/0055179 A1* | 3/2003 | Ota et al. | 525/242 |
| 2008/0057265 A1 | 3/2008 | Liang et al. | |
| 2008/0057292 A1* | 3/2008 | Bletsos et al. | 428/315.9 |

FOREIGN PATENT DOCUMENTS

| | | |
|---|---|---|
| JP | 7-243174 | 9/1995 |
| JP | 2003-8282 | 1/2003 |
| JP | 2004-276443 | 10/2004 |
| JP | 2008-221073 | 9/2008 |
| JP | 2008-223189 | 9/2008 |
| JP | 2009-158699 | 7/2009 |
| JP | 2009-267230 | 11/2009 |
| JP | 2010-65327 | 3/2010 |
| TW | 200718346 | 7/1995 |
| TW | 460386 | 10/2001 |
| TW | M288890 | 3/2006 |
| TW | M316629 | 8/2007 |
| TW | I304321 | 12/2008 |
| WO | WO 2010/101723 A2 | 9/2010 |

OTHER PUBLICATIONS

Supplemental European Search Report for corresponding application No. EP 10892317.7 dated Jul. 19, 2013.

English-language International Search Report from the Japanese Patent Office mailed Sep. 7, 2010, for International Application No. PCT/JP2010/062359.

* cited by examiner

ELECTROMAGNETIC SHIELDING SHEET

TECHNICAL FIELD

The present invention relates to an electromagnetic shielding sheet that has favorable electromagnetic wave shielding properties and enables the thickness of a base to be reduced.

BACKGROUND ART

The effects of electromagnetic waves leaking from electronic devices on digital devices has come to be a problem in recent years with the rapid advance of the use of digital technology in such electronic devices. In addition, not only have electromagnetic waves conventionally been known to cause erroneous operation by having an effect on electric signals flowing through electronic circuits, but there are also concerns regarding their effect on the body, and electromagnetic shielding materials have been developed as a countermeasure against this.

In addition, simultaneous to being required to demonstrate a high level of electromagnetic wave shielding (electromagnetic wave shielding properties), materials that have flexibility and bending resistance, are thin and are lightweight are desired for use as electromagnetic shielding materials.

Although electromagnetic shielding materials that use woven fabrics or non-woven fabrics are used as materials that satisfy these requirements, these fabrics have the problem of causing a decrease in electromagnetic wave shielding properties unless the weight per unit area and thickness of the woven fabric or non-woven fabric per se are increased and the amount of metal coating is also increased.

Means for solving this problem are disclosed in Patent Document 1 and Patent Document 2 indicated below in which adhesion of a metal coating and plating processability can be improved with a smaller increase in the thickness of the fabric after forming a metal coating in comparison with the prior art by using an electromagnetic shielding material obtained by laminating woven fabrics, non-woven fabrics or a woven fabric and non-woven fabric. In this case, however, in order to obtain desired electromagnetic wave shielding properties, there are the problems of an increase in the base thickness after forming the metal coating and an increase in thickness of the metal coating per se.

In addition, Patent Document 3 discloses a technology for coating a resin layer containing metal particles onto the surface of a fabric. In this technology, metal particles are coated with a resin in order to improve adhesion of a metal thin film layer, and the resulting sheet has ample flexibility. Thus, an object of the technology disclosed in Patent Document 3 is considered to be facilitating use when actually using an electromagnetic shielding sheet. However, the high level of electrical conductivity of the metal is conversely impaired by resin coating, ultimately resulting in a thick sheet that does not have high electromagnetic wave shielding properties.

Other attempts are disclosed in Patent Documents 4 and 5 in which electromagnetic wave shielding properties are attempted to be enhanced by using ultrafine fibers and utilizing the relatively high surface area obtained by carrying out metal processing on the surface of the fibers. However, in the fiber sheets disclosed in these documents, although a high-performance sheet is obtained by using ultrafine fibers, due to the weak strength of the ultrafine fiber sheet, it was unable to be used practically. Namely, although it is necessary to attach highly electrically conductive metal to polymer fibers in order to enhance electromagnetic wave shielding performance, and electroless plating by a wet method is typically used to obtain high levels of electrical conductivity and adhesiveness, in this process, the electrochemical reaction in the form of plating is repeated for multiple layers, while drying and exposure to a plating bath are also repeated many times. Consequently, the fabric itself ends up tearing or defects end up forming in the fabric during these processes, thereby preventing the obtaining of uniform processing. In addition, although it is necessary to deposit metal by placing in a vacuum chamber in the case of methods involving metal deposition, strength is unable to be imparted to the fabric at this time causing it to tear or causing defects to form in the fabric. In addition, in order to ensure reliable adhesion to the fiber surface, it is necessary to use a high vacuum and activate the surface of the fibers, and the fiber fabric was unable to withstand these processes.

In this manner, an electromagnetic shielding sheet that is effectively thin and demonstrates high performance has yet to be obtained.

CITATION LIST

Patent Documents

Patent Document 1: Japanese Unexamined Patent Publication No. 2004-276443
Patent Document 2: Japanese Unexamined Patent Publication No. H2-82696
Patent Document 3: Japanese Unexamined Patent Publication No. 2003-8282
Patent Document 4: Japanese Unexamined Patent Publication No. H7-243174
Patent Document 5: Japanese Unexamined Patent Publication No. 2010-65327

SUMMARY OF INVENTION

Problems to be Solved by the Invention

An object of the present invention is to provide an electromagnetic shielding sheet having superior electromagnetic wave shielding properties and a lower amount of adhered metal by reducing the increase in thickness of a base after forming a metal coating in comparison with conventional electromagnetic shielding sheets. In addition, another object of the present invention is to provide a sheet having high electromagnetic shielding properties capable of withstanding metal working processes and as a result thereof, is able to be composed of a fabric having reduced thickness and ample flexibility.

Means for Solving the Problems

As a result of conducting extensive studies to solve the aforementioned problems, the inventors of the present invention found that an electromagnetic shielding sheet having a thin fabric and superior electromagnetic wave shielding properties by optimizing density by arranging a specific amount of an ultrafine fiber layer as a middle layer of a laminated non-woven fabric, and preferentially adhering metal to the ultrafine fiber layer, thereby leading to completion of the present invention.

Namely, the present invention is as indicated below.

[1] An electromagnetic shielding sheet composed of a laminated non-woven fabric having at least a first layer and a second layer, wherein the first layer is a thermoplastic synthetic fiber layer having a fiber diameter of 6 μm to 50

μm, the second layer is an ultrafine fiber layer having a fiber diameter of 0.1 μm to 5.0 μm, and a metal is adhered to at least one side of the sheet.

[2] The electromagnetic shielding sheet described in [1] above, further having a third layer composed of thermoplastic synthetic fibers having a fiber diameter of 6 μm to 50 μm.

[3] The electromagnetic shielding sheet described in [1] or [2] above, wherein the metal is adhered by electroless plating or sputtering.

[4] The electromagnetic shielding sheet described in any of [1] to [3] above, wherein the thickness of the laminated non-woven fabric is 10 μm to 100 μm.

[5] The electromagnetic shielding sheet described in any of [1] to [4] above, wherein the tensile strength of the non-woven fabric is 20 N/3 cm or more.

[6] The electromagnetic shielding sheet described in any of [1] to [5] above, wherein the content of the ultrafine fibers based on the total weight of the non-woven fabric is 12% by weight to 23% by weight.

[7] The electromagnetic shielding sheet described in any of [1] to [6] above, wherein the bulk density of the laminated non-woven fabric is 0.3 g/cm$^3$ to 0.8 g/cm$^3$.

[8] The electromagnetic shielding sheet described in any of [1] to [7] above, wherein the laminated non-woven fabric is obtained by a calendering treatment.

[9] The electromagnetic shielding sheet described in any of [1] to [8] above, wherein the surface resistivity of the sheet is a common logarithmic value of −2.0 Ω/□ to −0.2 Ω/□.

Effects of the Invention

The electromagnetic shielding sheet of the present invention improves adhesion of a metal coating by arranging ultrafine fibers in a middle layer while reducing an increase in thickness of a base after forming the metal coating, reduces the amount of metal coated, and demonstrates superior shielding properties consisting of electromagnetic wave shielding properties of 60 dB or more despite having a small amount of adhered metal. In addition, the electromagnetic shielding sheet of the present invention can be incorporated with a high degree of freedom in a highly integrated electronic device as a high-performance electromagnetic shielding sheet having reduced thickness and lighter weight due to the strength of the sheet.

EMBODIMENTS FOR CARRYING OUT INVENTION

The following provides a detailed explanation of the present invention.

The present invention is an electromagnetic shielding sheet composed of a laminated non-woven fabric at least having a first layer and a second layer, wherein the first layer is a thermoplastic synthetic fiber layer having a fiber diameter of 6 μm to 50 μm, the second layer is an ultrafine fiber layer having a fiber diameter of 0.1 μm to 5.0 μm, and a metal is adhered to at least one side of the sheet. In addition, the electromagnetic shielding sheet of the present invention can also be a sheet composed of a laminated non-woven fabric of a sandwich structure having a first layer on the second layer of the aforementioned laminated non-woven fabric.

The structural characteristics of the electromagnetic shielding sheet of the present invention and the effects demonstrated thereby are as indicated below.

(1) The sheet of the present invention has a structure in which large gaps between fibers formed by a layer of thermoplastic synthetic fibers having a comparative large fiber diameter are filled in by a layer of ultrafine fibers having a comparatively small fiber diameter, and demonstrates high surface exposure of an ultrafine fiber layer. Consequently, metal can be preferentially adhered to the ultrafine fiber layer, and as a result thereof, the effective surface area where metal is adhered can be increased considerably, and this is thought to enable superior shielding effects to be manifested with less adhered metal.

(2) The sheet of the present invention preferably has the structure of a laminated non-woven fabric in which a middle layer is composed of an ultrafine fiber layer. The ultrafine fiber layer is able to as an adhesive layer, and the density of the entire sheet is increased. As a result, a thin, flexible sheet is thought to be able to be obtained.

Although the thermoplastic synthetic fibers used in the first layer and/or third layer of the laminated non-woven fabric of the present invention can be suitably determined according to the usage environment and processing conditions, they are preferably polyester-based fibers such as polyethylene terephthalate, polybutylene terephthalate or copolymer polyester, a polyamide-based fibers such as nylon 6, nylon 66 or copolymer polyamide fiber, or crystalline engineering plastics such as PPS fibers. The fibers used in the present invention are used as the base of the electromagnetic shielding sheet, and are preferably polyester-based fibers or PPS fibers from the viewpoint of being able to withstand metal working processes, and particularly wet plating processes, and maintain a high degree of adhesion with metal, or from the viewpoint of dimensional stability when wet.

In the present invention, the fiber diameter of the thermoplastic synthetic fibers used in the first layer and third layer of the laminated non-woven fabric is 6 μm to 50 μm, preferably 8 μm to 30 μm and more preferably 8 μm to 20 μm. If the fiber diameter is 6 μm or more, the strength of the resulting sheet is strong and as a result thereof, processability during metal working is favorable, and an electromagnetic shielding sheet can be obtained more efficiently. If the fiber diameter if 50 μm or less, a high-performance electromagnetic shielding sheet can be obtained since comparatively large fiber gaps are obtained, the second sheet consisting of ultrafine fibers is easily exposed on the surface of the sheet, metal working is carried out more efficiently on the ultrafine fibers exposed on the surface, and a continuous metal layer is formed.

In the surface structure of the sheet of the present invention, the thermoplastic synthetic fiber layer having a comparatively large fiber diameter has comparatively large gaps between fibers, and the size of the gaps between fibers in terms of pore size is preferably 30 μm to 10000 μm, more preferably 50 μm to 1000 μm and even more preferably 50 μm to 300 μm.

The material of the ultrafine fibers used in the second layer of the laminated non-woven fabric can be suitably determined according to the usage environment and processing conditions. In addition, the material may be the same as or different from that of the thermoplastic synthetic fibers used in the first layer and/or third layer of the laminated non-woven fabric. Preferable examples include polyester-based fibers such as polyethylene terephthalate, polybutylene terephthalate or copolymer polyester, polyamide-based fibers such as nylon 6, nylon 66 or copolymer polyamide fibers, and crystalline engineering plastics such as PPS fibers. The ultrafine fibers used in the present invention are used in a laminated non-woven fabric used as a base of the electromagnetic shielding sheet, and similar to the reasons for using the resins used in the first and third layer, and from the viewpoint of the need for the metal layer to be adhered more firmly, polyester-based fibers and PPS fibers are preferable.

Figure 1:
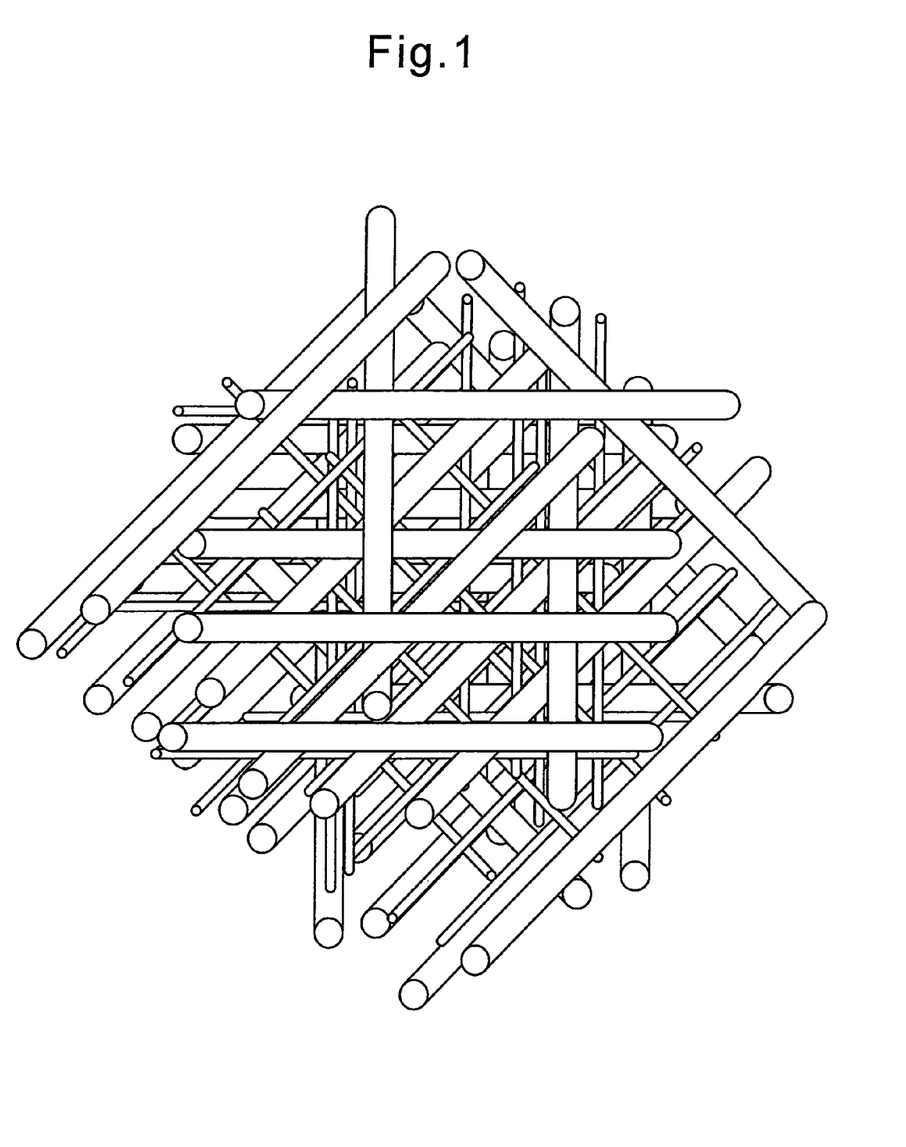
FIG. 1 is an overhead schematic diagram of a non-woven fabric having an ultrafine fiber layer in a second layer.
Figure 2:
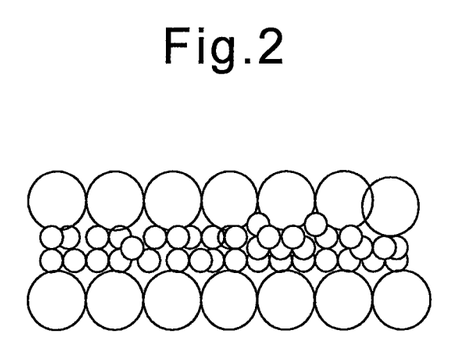
FIG. 2 is a cross-sectional schematic diagram of a non-woven fabric having an ultrafine fiber layer in a second layer.

The layer of ultrafine fibers serving as the second layer is arranged so as to fill in such gaps between fibers. Metal can be preferentially adhered to the ultrafine fiber layer by carrying out treatment in which metal is adhered to a sheet surface having this type of surface structure. FIG. 1 is an overhead schematic diagram showing the state of the surface of ultrafine fibers, while FIG. 2 is a cross-sectional schematic diagram showing the state of a cross-section.

The ratio of exposed surface area to the surface of the ultrafine fiber layer is preferably 20% or more, more preferably 50% to 90% and even more preferably 60% to 80%. Metal is adhered to the ultrafine fiber layer corresponding to the exposed surface area ratio. Consequently, the metal forms a continuous layer and higher shielding effects can be demonstrated.

For example, in a specific aspect of the present invention, in the case of a polyester-based fiber layer in which the fiber diameters of the upper layer and lower layer are 13 μm, the polyester-based fiber layer has a fiber gap of a diameter of 120 μm, and that gap is completely filled in with an ultrafine fiber layer having a microscopic fiber diameter.

The fiber diameter of the ultrafine fibers that compose the second layer is 0.1 to 5.0 μm and preferably 0.4 μm to 3.0 μm. In the case the fiber diameter of the ultrafine fibers is within the aforementioned ranges, the specific surface area of the ultrafine fiber layer increases and the distance between ultrafine fibers decreases, thereby enabling the formation of a favorable metal coating layer. If the fiber diameter of the ultrafine fibers is 0.1 μm or more, the resulting fibers and sheet have favorable quality in terms of producing the fibers. If the fiber diameter is less than 0.1 μm, the ultrafine fibers become entangled, or in the case of fibers that are melted by heat, the fibers end up fusing, and since this results in the possibility of incidental looping and defects, a fiber diameter of 0.1 μm or more, is favorable. On the other hand, if the fiber diameter of the ultrafine fibers is 5.0 μm or less, since specific surface area increases and the quantity of fibers per unit volume or unit area increases, in the case of having worked metal, a more continuous metal coating is formed thereby enhancing electromagnetic wave shielding properties. In addition, in the same sense, the distance between fibers decreases and a more continuous metal coating is formed, again enhancing electromagnetic wave shielding properties.

The thickness of the laminated non-woven fabric is preferably 10 μm to 100 μm, more preferably 10 μm to 60 μm and even more preferably 10 μm to 40 μm. The electromagnetic shielding sheet of the present invention does not become bulky and can be installed in a confined space as a result of the non-woven fabric having such a thickness. If the thickness if 10 μm or more, the laminated non-woven fabric is strong, has adequate strength for metal working and allows an electromagnetic shielding sheet to be efficiently obtained, while on the other hand, if the thickness is 100 μm or less, the laminated non-woven fabric is thinner, more pliable and easy to use. Since the present invention is a laminated sheet having a first layer that primarily governs fabric strength, and a second layer that primarily governs shielding performance as a result of having a larger specific surface area during metal working, namely is that in which the roles of individual layers have been differentiated, a thinner, more pliable, high-performance electromagnetic shielding sheet is obtained.

The weight per unit area of each layer (first layer, second layer and/or third layer) of the laminated non-woven fabric is preferably each of the values indicated below according to the ratio of each layer.

The weight per unit area of the ultrafine fiber non-woven fabric layer serving as the second layer in the present invention is preferably 0.5 g/m$^2$ or more. If the weight per unit area is 0.5 g/m$^2$ or more, the distance between fibers does not become excessively large, metal used to process the ultrafine fiber non-woven fabric layer easily enters the gaps between fibers, and a uniform and dense continuous metal layer can be formed. In this sense, the weight per unit area of the ultrafine fiber non-woven fabric layer serving as the second layer is more preferably 1.5 g/m$^2$ or more.

The weight per unit area of the non-woven fabric layer composed of thermoplastic synthetic fibers serving as the first layer (and/or third layer) is preferably 5 g/m$^2$ or more and more preferably 7 g/m$^2$ or more. If the weight per unit area is 5 g/m$^2$ or more, since an adequate uniform distance between fibers can be obtained for use as a laminated non-woven fabric, a dense and uniform continuous metal layer can be formed. As was previously described with respect to fiber diameter, the ultrafine fiber layer that comprises the second layer is more homogeneously arranged between the fibers that comprise the first layer, and as a result thereof, ultrafine fibers can be distributed more uniformly for use as a laminated non-woven fabric. As a result, a dense and uniform continuous metal layer can be formed interposing a more homogeneously distributed ultrafine fiber layer. In addition, if the weight per unit area is 5 g/m$^2$ or more, adequate strength is retained for use as a laminated non-woven fabric, a metal working step becomes stable, and a desired sheet can be stably produced without any loss of shape of the laminated non-woven fabric layer.

The content of ultrafine fibers in the entire non-woven fabric is preferably 12% by weight to 23% by weight, more preferably 16% by weight to 23% by weight, and even more preferably 16% by weight to 20% by weight. In the case the content of ultrafine fibers is 12% by weight or more, specific surface area increases and distance between fibers stabilizes, while on the other hand, in the case the content of ultrafine fibers is 23% by weight or less, the fabric tension of thermoplastic polymer layer of the first layer increases thereby resulting in favorable resistance to surface napping. In any case, ensuring the required thickness and weight per unit area is important, and are suitably selected within the ranges thereof.

The bulk density of the laminated non-woven fabric is preferably 0.3 g/cm$^3$ to 0.8 g/cm$^3$, more preferably 0.5 g/cm$^3$ to 0.7 g/cm$^3$ and even more preferably 0.5 g/cm$^3$ to 0.7 g/cm$^3$. In the case the bulk density is 0.3 g/cm$^3$ or more, the laminated non-woven fabric has superior fabric strength, the distance between fibers does not become excessively large, a metal easily forms a continuous layer during metal working and the laminated non-woven fabric has a higher performance level of electromagnetic wave shielding properties. On the other hand, if the bulk density is 0.8 g/cm$^3$ or less, the fabric is light, there is favorable liquid permeability during electroless plating, and both gas and liquid permeability remain in terms of the inherent properties of non-woven fabric materials, thereby making this favorable. If only electromagnetic wave shielding properties are required, then a metal layer may be provided on a film or sheet, or a metal foil per se may be used.

Although the non-woven fabric is composed of fibers and a void layer consisting of the gaps there between, the aggregate shape of the void layer is typically random. For example, in the case of examining the pore size distribution of an ordinary spunbound non-woven fabric (having a fiber diameter of 15 μm to 40), the average pore size distribution exceeds 30 μm. In addition, the maximum pore size exceeds 50 μm. Namely, voids having an approximate diameter of 50 μm or more are contained in the non-woven fabric. In the case of a non-woven fabric having a small fiber diameter and small thickness in particular, there are portions present having a large pore size of several millimeters or more. If pore size is excessively large, metal that has been worked at the location of those pores does not enter inside and a continuous metal layer is not formed, thereby increasing susceptibility to leakage of electromagnetic waves. In this sense, the distance between fibers in the present invention is reduced as a result of having this ultrafine fiber layer, or in other words, pore size is small thereby facilitating the production of a uniform, continuous metal layer. Consequently, the average pore size of the laminated non-woven fabric of the present invention is 0.3 μm to 20 μm. If the average pore size is 0.3 μm or more, the worked metal easily enters the pores enabling the realization of a high-performance electromagnetic wave shielding properties. If the average pore size is 20 μm or less, the distance between fibers is suitable, worked metal and electrolyte used for electroless plating easily enters the pores, and as a result thereof, a favorable continuous metal layer can be formed, thereby enabling the realization of high-performance electromagnetic wave shielding properties.

In the present invention, the tensile strength of the laminated non-woven fabric is preferably 20 N/3 cm or more. If the tensile strength if 20 N or more, the electromagnetic shielding sheet can be produced more efficiently without the laminated sheet tearing and without the formation of wrinkles in electroless plating, vacuum deposition and sputtering steps.

The laminated non-woven fabric is preferably obtained by a calendering treatment. Since the ultrafine fibers that compose the middle layer of the laminated non-woven fabric fulfill the role of an adhesive and the occurrence of interlayer separation of the laminated non-woven fabric is prevented as a result of calendering treatment, a laminated non-woven fabric can be obtained that has higher strength and better dimensional stability. The tensile strength of the laminated non-woven fabric is more preferably 25 N/3 cm or more.

In the present invention, metal is adhered to at least one side of the sheet. In the case of a two-layer laminated non-woven fabric, metal working is preferably carried out on the side of the ultrafine fiber layer serving as the second layer.

Electroless plating, metal deposition or sputtering is preferable for the method used to adhere the metal. In addition, in order to obtain an electromagnetic shielding shield having higher performance, electroless plating is more preferable in the sense that a metal layer can be adhered more uniformly and in a larger amount. Since the present sheet has favorable strength and dimensional stability and is able to withstand this electroless plating step, it is able to demonstrate a higher level of performance with respect to electromagnetic wave shielding properties.

There are no particular limitations on the metal used for the metal coating layer. Examples of metals that can be used include known metals such as copper, nickel, zinc, aluminum, tin, silver, gold, indium, chromium, platinum, iron, cobalt, molybdenum, titanium, palladium, SUS steel or niobium. At least one type of metal can be used for the metal coating layer. In a particularly preferable industrial aspect, nickel, copper, silver or gold and the like is preferable in the case of considering material costs, process loss and deterioration of electrical conductivity due to oxidation.

The preferable range of the amount of metal coated is 2 $g/cm^2$ to 50 $g/cm^2$ and more preferably 4 $g/m^2$ to 35 $g/m^2$.

In the present invention, although unable to be unequivocally defined since it is influenced by the fiber structure of the laminated non-woven fabric, preferably 20% by weight or more, more preferably 30% by weight to 90% by weight and even more preferably 50% by weight to 90% by weight of metal is preferably adhered to the ultrafine fibers. In the case 20% by weight or more of metal is adhered to the ultrafine fibers, shielding properties improve due to the increased ease of forming a continuous metal layer.

Although varying according to the degree of entanglement of fibers of the laminated non-woven fabric and the type and amount of metal adhered to the surface of the fabric, the surface resistivity of the electromagnetic shielding sheet of the present invention is preferably $-2.0\ \Omega/\square$ to $-0.2\ \Omega/\square$, more preferably $-1.8\ \Omega/\square$ to $-0.6\ \Omega/\square$, even more preferably $-1.8\ \Omega/\square$ to $-0.8\ \Omega/\square$ and most preferably $-1.8\ \Omega/\square$ to $-1.0\ \Omega/\square$ in terms of the common logarithmic value of surface resistivity for obtaining more reliable shielding performance. In the case the non-woven fabric structure is appropriate and uniform formation of a metal coating is favorable, favorable electromagnetic wave shielding properties are obtained by demonstrating a common logarithmic value of surface resistivity of $-0.2\ \Omega/\square$ or less. On the other hand, if the common logarithmic value of surface resistivity exceeds $-0.2\ \Omega/\square$, the metal coating is no longer uniform and it becomes difficult to obtain high electromagnetic wave shielding properties.

The electromagnetic shielding sheet of the present invention preferably demonstrates electromagnetic wave shielding properties of 43 dB or more, more preferably 53 dB or more, even more preferably 60 dB or more and most preferably 70 dB or more. Shielding properties of 43 dB or more are generally said to be at the level of practical use as an electromagnetic shielding sheet, and satisfying this value makes it possible to expand the range of applications in which the electromagnetic shielding sheet can be used practically. In any case, this value varies according to the structure and thickness of the laminated non-woven fabric as well as the type and amount of coated metal. The present invention allows the obtaining of these high performance levels of electromagnetic wave shielding properties, while also being a thin, light and flexible material.

The electromagnetic shielding sheet of the present invention is composed of a laminated non-woven fabric consisting of an ultrafine fiber non-woven fabric layer and non-woven fabric layer. Since the non-woven fabric layer and the ultrafine fiber non-woven fabric layer are both composed of thermoplastic resin, a method by which they are integrated into a single unit by hot embossing is preferable for the method used to laminate the ultrafine fiber non-woven fabric layer and the non-woven fabric layer since tensile strength and bending flexibility of the non-woven fabric can be maintained and thermal stability can be maintained. A preferable method consists of sequentially producing a spunbound non-woven fabric layer, melt blown non-woven fabric layer and spunbound non-woven fabric layer, laminating the layers, and pressing together using embossing rollers or flat rollers. Namely, at least one layer of spunbound non-woven fabric layer using thermoplastic synthetic fibers is spun on a conveyor, and at least one layer of an ultrafine fiber non-woven fabric layer having a fiber diameter of 0.1 μm to 5 μm is blown thereon by melt-blowing using a thermoplastic synthetic resin. Subsequently, a method is preferably employed in which the layers are integrated into a single unit by pressing together using embossing rollers or flat rollers. Moreover, a more preferable method consists of laminating at least one layer of a thermoplastic synthetic long filament non-woven fabric that uses a thermoplastic synthetic resin onto a melt blown non-woven fabric prior to hot pressing, and integrating into a single unit by pressing together using embossing rollers or flat rollers.

Since use of the production methods described above enables an ultrafine fiber non-woven fabric layer to be directly blown onto a thermoplastic synthetic long filament non-woven fabric layer by melt blowing, the ultrafine fibers are able to penetrate into the thermoplastic synthetic long filament non-woven fabric layer by melt blowing, thereby enabling the ultrafine fibers to fill in the gaps between fibers of the thermoplastic synthetic long filament non-woven fabric layer.

As a result thereof, since the ultrafine fibers penetrate into the thermoplastic synthetic long filament non-woven fabric and are fixed therein by melt blowing, not only does the strength of the structure per se of the laminated non-woven fabric improve, but it becomes difficult for interlayer separation to occur since there is less susceptibility to movement of the ultrafine fiber non-woven fabric layer by external forces. In addition, since the aggregate of the voids within the non-woven fabric layer can be made to be more uniform by the ultrafine fiber layer, a metal coating is formed uniformly. Since methods for obtaining a laminated non-woven fabric are disclosed in International Publication No. WO 2004/94136 and PCT/JP 2010/057624 (Japanese Patent Application No. 2009-111448), a laminated non-woven fabric optimal for the present application can be obtained by referring thereto.

EXAMPLES

Although the following provides a more detailed explanation of the present invention through examples thereof, the present invention is not limited to these examples. In addition, the various physical properties and characteristics of the electromagnetic shielding sheet of the present invention were measured in accordance with the methods indicated below.

(1) Weight per unit area (g/m$^2$): The weight of a sample measuring 24 cm×33 cm was converted to weight per square meter (m$^2$).

(2) Thickness (μm): Thicknesses at 10 locations per 1 m of width were measured in accordance with the method defined in JIS L-1906 followed by determination of the average value thereof. The load was 9.8 kPa.

(3) Average fiber diameter (μm): Enlarged micrographs were taken at a magnification of 500× with an electron microscope, followed by determining the average value for 10 fibers.

(4) Non-woven fabric tensile strength (N/3 cm): Test pieces having a width of 30 mm and a length of about 250 mm were sampled from five locations per 1 m of width, and tensile strength and rupture elongation at a clamping interval of 100 mm and tension speed of 300 mm/min followed by determination of the average value thereof.

(5) Pore size distribution: A palm porometer (Model CFP-1200AEX) manufactured by PMI Corp. was used for testing. Samples were immersed in an immersion liquid using Silwick manufactured by PMI Corp. for the immersion liquid followed by adequately degassing and measuring. In the measuring device used for this testing, the filter was first immersed in a liquid having a known surface tension followed by applying pressure to the filter from the state in which all of the pores of the filter were covered with a film of the liquid, and measuring the pore size of the pores as calculated from the pressure at which the liquid film broke and the surface tension of the liquid. The following equation (3) was used for calculations.

$$d = C\gamma/P \quad (3)$$

In the equation, d (units: μm) represents the pore diameter of the filter, γ (units: mN/m) represents the surface tension of the liquid, P (units: Pa) represents the pressure at which the liquid film over the pores broke, and C represents a constant.

According to equation (3), when the flow rate (wet flow rate) is measured in the case of continuously changing the pressure P applied to the filter immersed in the liquid from a low pressure to a high pressure, since the liquid film of the largest pores is not broken at the initial pressure, the flow rate is 0. As the pressure is increased, the liquid of the largest pores is broken resulting in generation of flow (bubble void). Moreover, as the pressure is further increased, the flow rate increases corresponding to each pressure, the liquid film of the smallest pores is broken, and the flow rate coincides with the flow rate in a dry state (dry flow rate). In the measuring device used for this testing, the value obtained by dividing the wet flow rate at a certain pressure by the dry flow rate at the same pressure is referred to as the cumulative filter flow rate (units: %). The pore size of the liquid film that is broken at a pressure at which the cumulative filter flow rate is 50% is referred to as the average flow rate pore size. The maximum pore size in the present invention was taken to be the pore size of the liquid film at which the cumulative filter flow rate was within the range of −2σ of 50%, namely the pore size of the liquid film that broke at pressure at which the cumulative filter flow rate is 2.3%.

(6) Ratio of exposed surface area (%): An SEM micrograph was taken of the surface of the non-woven fabric, the micrograph was enlarged and printed out on graph paper, and the ratio at which ultrafine fibers appeared on the surface of the non-woven fabric was determined from the weight of the graph paper.

(7) Bulk density (g/cm$^3$): The value obtained by dividing the fiber density (g/m2) of the non-woven fabric by the thickness (μm) of the non-woven fabric was used as the value of bulk density (g/cm$^3$).

(8) Air flow resistance (kPa·s/m): Air flow resistance (kPa·s/m)a was measured based on the pressure difference at an air permeability of 4 cm$^3$/cm$^2$·s using the KES-F8-AP1 air flow resistance tester manufactured by Kato Tech Co., Ltd.

(9) Metal adhesion quantity (g/m$^2$): The value obtained by subtracting the uncoated fiber density prior to processing from the fiber density after metal coating processing was used for the value of metal adhesion quantity.

(10) Metal coating thickness (μm): A scanning electron micrograph (SEM) of a cross-section of a metal-coated non-woven fabric was taken, followed by measurement of the thickness of the metal-coated layer (average value of n=20 points).

(11) Appearance of metal adhesion (contrast): The status of metal coating formation was observed visually and evaluated in the manner indicated below.
  A: Uniformly formed metal coating
  B: Partially non-uniform metal coating with spots present depending on the location
  C: Non-uniform metal coating (12) Processability (Evaluation)
Processability during continuous processing was evaluated based on the following evaluation criteria.
  A: Extremely good
  B: Somewhat good
  C: Poor In the case of being evaluated as poor, the cause of the poor processability is described in the examples.

(13) Model test of ease of metal adhesion (metal adhesiveness)

Pressure-sensitive adhesive tape was affixed to the resulting sample followed by peeling off the tape, observing adhesion status, and evaluating according to the following evaluation criteria.

A: Metal not present on tape surface after peeling
B: Metal present appeared on tape surface
C: Metal and fiber strands appeared on tape surface (14) Electromagnetic wave shielding properties (dB): Electromagnetic shielding properties (dB, near field shielding properties) at 100 MHz and 1 GHz were evaluated according to the KEC method.

(15) Surface resistivity ($\Omega/\square$): Surface resistivity was measured according to a method complying with JIS-K7194 using an ASP probe. Surface resistivity was indicated as a common logarithmic value obtained by measuring a metal-coated surface (deposited surface in the case of deposition and the like) and determining the average for n=9.

Example of Production of Non-Woven Fabric and Metal Plating

General-purpose polyethylene terephthalate was extruded with a group of long filaments facing towards the movement capturing surface at a spinning temperature of 300° C. by spun bonding, the fibers were spun at a spinning speed of 3500 m/min and then charged to about 3 µC/g by coronal discharge to adequately open the fibers, and an unbound long filament web composed of filaments having an average fiber diameter of 16 µm and having uniformity on the order of a 5 cm fluctuation rate of 15% or less was prepared on the surface of a capturing net at a weight per unit area of 12.5 g/m$^2$ (Non-Woven Fabric Layer A).

On the other hand, polyethylene terephthalate (melt viscosity ηsp/c: 0.50) was spun by melt blowing under conditions of a spinning temperature of 300° C., hot air temperature of 320° C. and air discharge rate of 1000 Nm$^3$/hr/m, followed by blowing ultrafine fibers having an average fiber diameter of 1.6 µm directly towards the long filament web formed in the manner described above as a random web having a weight per unit area of 5 g/m$^2$ (Ultrafine Fiber Layer B). The distance from the melt blowing nozzle to the upper surface of the long filament web was made to be 100 mm, the suction at the capturing surface directly beneath the melt blowing nozzle was set to 0.2 kPa, and the air velocity was set to about 7 m/sec. Next, the laminated web was hot-pressed by passing between flat rollers to obtain a laminated non-woven fabric.

Moreover, the polyethylene terephthalate long filament web was opened in the same manner as the initially prepared non-woven fabric (Non-Woven Fabric A) prior to hot-pressing to directly prepare a three-layer laminated web composed of A/B/A.

Next, the laminated web was passed between flat rollers and hot-pressed to obtain a laminated non-woven fabric.

The aforementioned laminated non-woven fabrics were immersed for 2 minutes in an aqueous solution containing 0.3 g/L of palladium chloride, 30 g/L of cuprous chloride and 300 ml/L of 36% hydrochloric acid to clean the fiber surface of the laminated non-woven fabric. Continuing, the non-woven fabrics were immersed for 5 minutes in hydroborofluoric acid having an acid concentration of 0.1 N at 40° C. followed by rinsing with water. Next, after immersing for 5 minutes in an electroless copper plating solution composed of 7.5 g/L of copper sulfate, 30 ml/L of 37% formalin and 85 g/L of Rochelle salt at 40° C., the laminated non-woven fabrics were rinsed with water. Continuing, the laminated non-woven fabrics were immersed for 10 minutes in a pH 7.3 electric nickel plating solution composed of 300 g/L of nickel sulfamate, 30 g/L of boric acid and 15 g/L of nickel chloride at 35° C. and a current density of 5 A/dm$^2$ followed by rinsing with water after laminating the nickel to obtain electromagnetic shielding sheets. All of the resulting sheets were fabrics of 1 mW, and continuously wound sheets were obtained by continuously immersing in the solutions of each step, rinsing with water and drying.

Example 1

The composition of base materials having the fiber diameters and weight per unit areas of the first layer, second layer and third layer of a laminated non-woven fabric composed of polyester fibers obtained according to the aforementioned method is shown in the following Table 1. The electromagnetic shielding sheet obtained in the aforementioned production example demonstrated favorable metal adhesion, a small increase in thickness after metal working of 3 µm, and high shielding properties. The evaluation results are similarly shown in the following Table 1. The resulting electromagnetic shielding sheet had an extremely thin thickness after metal forming of 30 µm and demonstrated high shielding properties (65 dB).

Example 2

A laminated non-woven fabric of polyester fibers obtained in the same manner as Example 1 was processed by sputtering to obtain an electromagnetic shielding sheet. Sputtering was carried out using a vacuum deposition device and a standard board manufactured by Nilaco Corp. (Model SF-106 Tungsten) for the heat source. Basic conditions consisted of a degree of vacuum of $5\times10^{-5}$ torr, applied voltage of 5 V and deposition time of 180 seconds.

The resulting electromagnetic shielding sheet did not demonstrate protrusion of metal from the back of the fabric by the ultrafine fibers used in the non-woven fabric and a uniform metal coating was able to be formed on the surface of the fibers. The evaluation results are shown in the following Table 1.

Example 3

A laminated non-woven fabric composed of polyester fibers and having a width of 1 m was obtained using the same method as Example 1 while changing the orifice diameter, spinning temperature, spinning speed, suction force and air velocity. The properties of the resulting non-woven fabric are shown in the following Table 1. In addition, a metal-coated electromagnetic shielding sheet was obtained by electroless plating in the same manner as Example 1 followed by observation of its physical properties and electromagnetic wave shielding properties. The evaluation results are similarly shown in the following Table 1.

Example 4

A metal-coated electromagnetic shielding sheet was obtained by using the same non-woven fabric as that of Example 3 but shortening the treatment time of electroless plating, followed by observing the physical properties and electromagnetic wave shielding properties thereof. The evaluation results are shown in the following Table 1.

Example 5

A metal-coated electromagnetic shielding sheet was obtained by using the same non-woven fabric as that of Example 3 but extending the treatment time of electroless plating, followed by observing the physical properties and electromagnetic wave shielding properties thereof. The evaluation results are shown in the following Table 1.

Examples 6 to 10

Laminated non-woven fabrics were obtained under the same conditions as Example 3 while changing the weight per unit area and thickness of the non-woven fabric. The properties of the resulting non-woven fabrics are shown in the following Table 1. In addition, metal-coated electromagnetic shielding sheets were obtained by electroless plating in the same manner as Example 1 followed by observation of the physical properties and electromagnetic wave shielding properties thereof. The evaluation results are similarly shown in the following Table 1.

Examples 11 and 12

Spunbound non-woven fabrics were obtained under the same conditions as Example 3 followed by obtaining laminated non-woven fabrics in the same manner as Example 3 with the exception of changing the orifice diameter, spinning temperature, suction force and air velocity of the melt-blown non-woven fabric and changing the fiber diameter of melt-blown non-woven fabric. The physical properties of the resulting non-woven fabrics are shown in the following Table 1 and Table 2. In addition, metal-coated electromagnetic shielding sheets were obtained by electroless plating in the same manner as Example 1 followed by observation of the physical properties and electromagnetic wave shielding properties thereof. The evaluation results are similarly shown in the following Table 1 and Table 2.

Examples 13 and 14

Melt-blown non-woven fabrics were obtained in the same manner as Example 3 followed by obtaining laminated non-woven fabrics in the same manner as Example 3 with the exception of changing the orifice diameter, spinning temperature and spinning speed of the spunbound non-woven fabric and changing the fiber diameter of spunbound non-woven fabric. The physical properties of the resulting non-woven fabrics are shown in the following Table 2. In addition, metal-coated electromagnetic shielding sheets were obtained by electroless plating in the same manner as Example 1 followed by observation of the physical properties and electromagnetic wave shielding properties thereof. The evaluation results are similarly shown in the following Table 2.

Examples 15 and 16

PPS (Fortron manufactured by Polyplastics Co., Ltd.) was used as thermoplastic resin. The conditions for producing non-woven fabrics were as follows: first layer: resin melt viscosity (70 g/10 min, measurement conditions: load 5 kg, 315.6° C.), spinning temperature: 320° C., spinning speed: (Example 15: 8000 m/min, Example 16: 7500 m/min), second layer: resin melt viscosity (670 g/10 m, measurement conditions: load 5 kg, 315.6° C.), spinning temperature: 340° C., hot air temperature: 390° C., hot air velocity: (Example 15: 1000 Nm$^3$/hr/m, Example 16: 1200 Nm$^3$/hr/m). In addition, hot-pressing conditions using flat rollers consisted of a line pressure of 260 N/cm, roller temperatures (upper/lower) of 170° C./170° C., while calendering conditions consisted of a line pressure of 350 N/cm and roller temperature (upper/lower) of 235° C./235° C. Conditions for producing the laminated non-woven fabrics along with their performance are respectively shown in the following Table 2. Laminated non-woven fabrics were obtained by maintaining the other conditions to be the same as those of Example 1. The physical properties of the resulting non-woven fabrics are similarly shown in the following Table 2. In addition, metal-coated electromagnetic shielding sheets were obtained by electroless plating in the same manner as Example 1 followed by observation of the physical properties and electromagnetic wave shielding properties thereof. The evaluation results are similarly shown in the following Table 2.

Examples 17 and 18

A two-layer type of laminated non-woven fabric was obtained in the same manner as Example 3 and using the same method to produce the non-woven fabric as Example 3 with the exception of not layering a third layer (Example 17). The physical properties of the resulting non-woven fabric are shown in the following Table 2. In addition, a metal-coated electromagnetic shielding sheet was obtained by electroless plating in the same manner as Example 1 followed by observing the physical properties and electromagnetic wave shielding properties thereof. The evaluation results are similarly shown in the following Table 2.

Similarly, a two-layer type of laminated non-woven fabric was obtained in the same manner as Example 11 and using the same method to produce the non-woven fabric as Example 11 with the exception of not layering a third layer (Example 18). The physical properties of the resulting non-woven fabric are shown in the following Table 2. In addition, a metal-coated electromagnetic shielding sheet was obtained by electroless plating in the same manner as Example 1 followed by observation of the physical properties and electromagnetic wave shielding properties thereof. The evaluations results are similarly shown in the following Table 2.

Examples 19 to 21

Electromagnetic shielding sheets coated with silver were obtained by sputtering in the same manner as Example 2 onto a laminated non-woven fabric composed of polyester fibers and having a width of 1 m in the same manner as Example 3. The physical properties and electromagnetic wave shielding properties thereof were observed. Evaluation results are shown in the following Table 2. In addition, the sputtering time was adjusted to the metal adhesion quantities shown in Table 2 to obtain electromagnetic shielding sheets, followed by observation of the physical properties and electromagnetic wave shielding properties thereof. The evaluation results are similarly shown in the following Table 2.

Example 22

An electromagnetic shielding sheet coated with aluminum was obtained by sputtering in the same manner as Example 2 onto a laminated non-woven fabric composed of polyester fibers and having a width of 1 m in the same manner as Example 3. The electromagnetic shielding sheet was obtained by making the metal adhesion quantity that shown in the following Table 2, followed by observation of the physical properties and electromagnetic wave shielding properties thereof. The evaluation results are similarly shown in the following Table 2.

Example 23

A silver-coated electromagnetic shielding sheet was obtained by sputtering in the same manner as Example 2 onto the same two-layer type of laminated non-woven fabric as Example 17, followed by observation of the physical properties and electromagnetic wave shielding properties thereof. The evaluation results are shown in the following Table 2.

TABLE 1

| Ex. | Configuration | Layer | Weight per unit area g/m² | Material | Avg. fiber diam. μm | Thickness μm | Ultrafine fiber content % | Ultrafine fiber layer surface area ratio % | Bulk density g/cm³ | Air flow resistance kPa·s/m | Flow average pore size μm | Tensile strength N | Tensile elongation % |
|---|---|---|---|---|---|---|---|---|---|---|---|---|---|
| 1 | 3 layers | 1 | 8.1 | PET | 12 | 27 | 20 | 20 | 0.74 | 3 | 9 | 56 | 20 |
|  |  | 2 | 4 |  | 0.5 |  |  |  |  |  |  |  |  |
|  |  | 3 | 7.9 |  | 12 |  |  |  |  |  |  |  |  |
| 2 | 3 layers | 1 | 8.1 | PET | 12 | 27 | 20 | 20 | 0.74 | 3 | 9 | 56 | 20 |
|  |  | 2 | 4 |  | 0.5 |  |  |  |  |  |  |  |  |
|  |  | 3 | 7.9 |  | 12 |  |  |  |  |  |  |  |  |
| 3 | 3 layers | 1 | 8.3 | PET | 12 | 31.3 | 17 | 20 | 0.64 | 0.4 | 10 | 65 | 20 |
|  |  | 2 | 3.4 |  | 1.3 |  |  |  |  |  |  |  |  |
|  |  | 3 | 8.3 |  | 13 |  |  |  |  |  |  |  |  |
| 4 | 3 layers | 1 | Same as above | PET | Same as above | 31.3 | 17 | 20 | 0.64 | 0.4 | 10 | 65 | 20 |
|  |  | 2 |  |  |  |  |  |  |  |  |  |  |  |
|  |  | 3 |  |  |  |  |  |  |  |  |  |  |  |
| 5 | 3 layers | 1 | Same as above | PET | Same as above | 31.3 | 17 | 20 | 0.64 | 0.4 | 10 | 65 | 20 |
|  |  | 2 |  |  |  |  |  |  |  |  |  |  |  |
|  |  | 3 |  |  |  |  |  |  |  |  |  |  |  |
| 6 | 3 layers | 1 | 5.5 | PET | Same as above | 25.5 | 12 | 40 | 0.49 | 0.06 | 20 | 30 | 15 |
|  |  | 2 | 1.5 |  |  |  |  |  |  |  |  |  |  |
|  |  | 3 | 5.5 |  |  |  |  |  |  |  |  |  |  |
| 7 | 3 layers | 1 | 11.0 | PET | Same as above | 40 | 12.5 | 20 | 0.63 | 0.54 | 9 | 81 | 25 |
|  |  | 2 | 3.0 |  |  |  |  |  |  |  |  |  |  |
|  |  | 3 | 11.0 |  |  |  |  |  |  |  |  |  |  |
| 8 | 3 layers | 1 | 12.5 | PET | Same as above | 45.9 | 17 | 15 | 0.65 | 0.79 | 9 | 91 | 24 |
|  |  | 2 | 5.1 |  |  |  |  |  |  |  |  |  |  |
|  |  | 3 | 12.5 |  |  |  |  |  |  |  |  |  |  |
| 9 | 3 layers | 1 | 15.5 | PET | Same as above | 55.1 | 17 | 5 | 0.73 | 3 | 5 | 118 | 24 |
|  |  | 2 | 6.8 |  |  |  |  |  |  |  |  |  |  |
|  |  | 3 | 15.5 |  |  |  |  |  |  |  |  |  |  |
| 10 | 3 layers | 1 | 22.8 | PET | Same as above | 83.8 | 17.1 | 3 | 0.55 | 9 | 3.5 | 163 | 25 |
|  |  | 2 | 9.4 |  |  |  |  |  |  |  |  |  |  |
|  |  | 3 | 22.8 |  |  |  |  |  |  |  |  |  |  |
| 11 | 3 layers | 1 | 8.3 | PET | 12 | 31.7 | 17 | 20 | 0.63 | 1 | 9 | 70 | 25 |
|  |  | 2 | 3.4 |  | 0.3 |  |  |  |  |  |  |  |  |
|  |  | 3 | 8.3 |  | 13 |  |  |  |  |  |  |  |  |

| Metal Working | | | | | | Shielding Performance | | |
|---|---|---|---|---|---|---|---|---|
| Plating method | Metal species | Metal adhered quantity g/cm³ | Coated thickness μm | Adhered metal appearance | Metal adhesion | Processability | EM wave shielding properties | | Surface resistivity log Ω/☐ |
| | | | | | | | 100 MHz (dB) | 1 GHz (dB) | |
| Electroless plating | Copper, nickel | 7 | 3 | A | A | A | 65 | 68 | −1.1 |
| Sputtering | Silver | 3 | 2 | A | A | A | 53 | 42 | −0.9 |
| Electroless plating | Copper, nickel | 12 | 4 | A | A | A | 67 | 69 | −1.2 |
| Same as above | Same as above | 6 | 3 | A | A | A | 63 | 60 | −1 |
| Same as above | Same as above | 20 | 5 | A | A | A | 77 | 81 | −1.9 |
| Same as above | Same as above | 5 | 2 | A | A | A | 58 | 59 | −0.8 |
| Same as above | Same as above | 10 | 3 | A | A | A | 65 | 65 | −1.1 |
| Same as above | Same as above | 14 | 3 | A | A | A | 67 | 70 | −1.3 |

TABLE 1-continued

| | | | | | | | | | |
|---|---|---|---|---|---|---|---|---|---|
| Same as above | Same as above | 21 | 5 | A | A | A | 75 | 82 | −1.8 |
| Same as above | Same as above | 35 | 7 | A | A | A | 79 | 87 | −1.9 |
| Same as above | Same as above | 20 | 5 | A | A | A | 79 | 79 | −1.5 |

TABLE 2

| | | Non-Woven Fabric Composition | | | | Non-Woven Fabric Properties | | | | | | |
|---|---|---|---|---|---|---|---|---|---|---|---|---|
| | | | | | | Ultrafine | | Flow | | | | |
| Ex. | Configuration | Layer | Weight per unit area g/m² | Material | Avg. fiber diam. μm | Thickness μm | Ultrafine fiber content % | fiber layer surface area ratio % | Bulk density g/cm³ | Air flow resistance kPa·s/m | average pore size μm | Tensile strength N | Tensile elongation % |
| 12 | 3 layers | 1 | 8.3 | PET | 12 | 31.2 | 17 | 20 | 0.64 | 0.08 | 15 | 65 | 25 |
| | | 2 | 3.4 | | 4.0 | | | | | | | | |
| | | 3 | 8.3 | | 13 | | | | | | | | |
| 13 | 3 layers | 1 | 8.3 | PET | 9 | 30.6 | 17 | 20 | 0.65 | 0.5 | 10 | 77 | 25 |
| | | 2 | 3.4 | | 1.6 | | | | | | | | |
| | | 3 | 8.3 | | 9 | | | | | | | | |
| 14 | 3 layers | 1 | 8.3 | PET | 16 | 32.7 | 17 | 20 | 0.61 | 0.4 | 10 | 60 | 25 |
| | | 2 | 3.4 | | 1.6 | | | | | | | | |
| | | 3 | 8.3 | | 16 | | | | | | | | |
| 15 | 3 layers | 1 | 11.0 | PPS | 16 | 37.5 | 12 | 20 | 0.67 | 0.3 | 14 | 86 | 16 |
| | | 2 | 3.0 | | 1.6 | | | | | | | | |
| | | 3 | 11.0 | | 16 | | | | | | | | |
| 16 | 3 layers | 1 | 11.0 | PPS | 18 | 41.6 | 12 | 20 | 0.60 | 0.4 | 12 | 76 | 22 |
| | | 2 | 3.0 | | 1.2 | | | | | | | | |
| | | 3 | 11.0 | | 18 | | | | | | | | |
| 17 | 2 layers | 1 | 16.6 | PET | 12 | 38.4 | 17 | 100 | 0.52 | 0.4 | 10 | 58 | 19 |
| | | 2 | 3.4 | | 1.6 | | | | | | | | |
| | | 3 | — | | — | | | | | | | | |
| 18 | 2 layers | 1 | Same as above | PET | 12 | 44.5 | 17 | 100 | 0.45 | 0.5 | 11 | 59 | 22 |
| | | 2 | | | 0.3 | | | | | | | | |
| | | 3 | | | — | | | | | | | | |
| 19 | 3 layers | 1 | 8.3 | PET | 12 | 31.3 | 17 | 20 | 0.64 | 0.4 | 10 | 65 | 20 |
| | | 2 | 3.4 | | 1.6 | | | | | | | | |
| | | 3 | 8.3 | | 13 | | | | | | | | |
| 20 | 3 layers | 1 | Same as above | PET | Same as above | 31.3 | 17 | 20 | 0.64 | 0.4 | 10 | 65 | 20 |
| | | 2 | | | | | | | | | | | |
| | | 3 | | | | | | | | | | | |
| 21 | 3 layers | 1 | Same as above | PET | Same as above | 31.3 | 17 | 20 | 0.64 | 0.4 | 10 | 65 | 20 |
| | | 2 | | | | | | | | | | | |
| | | 3 | | | | | | | | | | | |
| 22 | 3 layers | 1 | Same as above | PET | Same as above | 31.3 | 17 | 20 | 0.64 | 0.4 | 10 | 65 | 20 |
| | | 2 | | | | | | | | | | | |
| | | 3 | | | | | | | | | | | |
| 23 | 2 layers | 1 | 16.6 | PET | 12 | 38.4 | 17 | 100 | 0.52 | 0.4 | 10 | 58 | 19 |
| | | 2 | 3.4 | | 1.6 | | | | | | | | |
| | | 3 | — | | — | | | | | | | | |

| | | Metal Working | | | | | Shielding Performance | | Surface resistivity log Ω/☐ |
|---|---|---|---|---|---|---|---|---|---|
| Plating method | Metal species | Metal adhered quantity g/cm³ | Coated thickness μm | Adhered metal appearance | Metal adhesion | Processability | EM wave shielding properties | | |
| | | | | | | | 100 MHz (dB) | 1 GHz (dB) | |
| Electroless plating | Copper, nickel | 10 | 3 | A | A | A | 55 | 41 | −0.6 |
| Same as above | Same as above | 14 | 4 | A | A | A | 66 | 61 | −1.1 |
| Same as above | Same as above | 13 | 4 | A | A | A | 65 | 64 | −1 |
| Same as above | Same as above | 14 | 4 | A | A | A | 65 | 63 | −1.1 |
| Same as above | Same as above | 15 | 4 | A | A | A | 68 | 71 | −1 |
| Same as above | Same as above | 11 | 3 | A | A | A | 64 | 70 | −0.9 |

TABLE 2-continued

| | | | | | | | | | |
|---|---|---|---|---|---|---|---|---|---|
| Same as above | Same as above | 14 | 4 | A | A | B | 70 | 75 | −1.2 |
| Sputtering | Silver | 6 | 2 | A | A | A | 59 | 51 | −0.8 |
| Same as above | Same as above | 2 | 1 | A | A | A | 48 | 40 | −0.4 |
| Same as above | Same as above | 14 | 3 | A | A | A | 67 | 76 | −1.2 |
| Sputtering | Aluminum | 6 | 2 | A | A | A | 43 | 38 | −0.2 |
| Sputtering | Silver | 7 | 2 | A | A | B | 60 | 65 | −1.3 |

Comparative Example 1

An electromagnetic shielding sheet (metal adhesion quantity: 8 g/m², surface resistivity: −0.66 Ω/□) was obtained by processing a thermal bonded single-layer non-woven fabric composed of polyester fibers (thickness: 85 μm, apparent density: 0.23 g/cm³) in the same manner as Example 1. With respect to processability, a large number of wrinkles formed during the course of processing due to the large thickness of the processed product and the hardness of the sheet. In addition, since the thickness after metal coating was 90 μm, the resulting sheet was not suitable for use in compact electronic devices. The evaluation results are shown in the following Table 3.

Comparative Example 2

An electromagnetic shielding sheet (metal adhesion quantity: 4 g/m², surface resistivity: −0.32 Ω/□) was obtained by processing a thermal bonded single-layer laminated non-woven fabric composed of polyester fibers (thickness: 85 μm, bulk density: 0.23 g/cm³) by sputtering in the same manner as described above. Since the resulting electromagnetic shielding sheet does not have an ultrafine fiber layer, the metal protruded from the back of the sheet making it difficult to form a uniform metal coating. The evaluation results are shown in the following Table 3.

Comparative Example 3

A spunbound non-woven fabric manufactured by Asahi Kasei Fibers Corp. (E05025, weight per unit area: 25 g/m²) was used for the non-woven fabric. The composition and performance results of the non-woven fabric are shown in the following Table 3. Next, an electromagnetic shielding sheet was obtained using the same method as Example 1 by carrying out metal working without carrying out electroless plating, followed by observation of the physical properties and electromagnetic wave shielding properties thereof. With respect to processability, a large number of wrinkles formed during the course of processing due to the large thickness of the processed product and the hardness of the sheet. In addition, since the thickness after metal coating was about 120 μm, the resulting sheet was not suitable for use in compact electronic devices. The evaluation results are shown in the following Table 3.

Comparative Examples 4 to 6

Single-layer non-woven fabrics were respectively obtained in Comparative Examples 4, 5 and 6 having a weight per unit area of only the non-woven fabric of the first layer among the layers of the laminated non-woven fabric used in Examples 3, 13 and 14 for the non-woven fabric. Next, electromagnetic shielding sheets were obtained using the same method as Example 1 by carrying out metal working without carrying out electroless plating, followed by observation of the physical properties and electromagnetic wave shielding properties thereof. With respect to processability, a large number of wrinkles formed during the course of processing due to the large thickness of the processed products and the hardness of the sheets. In addition, since the thickness after metal coating was thick, the resulting sheets were not suitable for use in compact electronic devices. The evaluation results are shown in the following Table 3.

Comparative Examples 7 to 9

Single-layer non-woven fabrics were respectively obtained in Comparative Examples 7 and 8 having different fiber densities for only the non-woven fabric of the second layer among the layers of the laminated non-woven fabric used in Examples 3 and 11 for the non-woven fabric. Next, although metal working was attempted to be carried out by electroless plating using the same method as Example 1, the non-woven fabric ended up tearing or shrinking during metal working, and favorable continuous electromagnetic shielding sheets were unable to be obtained. However, test pieces measuring 20 cm×20 cm were obtained in the laboratory by using same time setting for the plating time only without applying tension to the non-woven fabrics. The shielding performance thereof is shown in the following Table 3.

In addition, a heat-set non-woven fabric was obtained by fixing the same non-woven fabric as Example 7 to a constant length and width (Comparative Example 9). Next, although metal working was attempted to be carried out by electroless plating using the same method as Example 1, the non-woven fabric ended up tearing, although not shrinking, during metal working, and a favorable continuous electromagnetic shielding sheet was unable to be obtained. However, a test piece measuring 20 cm×20 cm was obtained in the laboratory by using the same time setting for the plating time only without applying tension to the non-woven fabric. The shielding performance thereof is shown in the following Table 3.

Comparative Examples 10 and 11

The desired metal-coated electromagnetic shielding sheets were obtained by using the same laminated non-woven fabric as that of Example 3 for the non-woven fabric but shortening the plating time, followed by observing the physical properties and electromagnetic wave shielding properties thereof. The evaluation results are shown in the following Table 3.

Comparative Example 12

A spunbound non-woven fabric manufactured by Asahi Kasei Fibers Corp. (E05025, weight per unit area: 25 g/m²) was used for the non-woven fabric. The composition and performance results of the non-woven fabric are shown in the following Table 3. Next, an electromagnetic shielding sheet was obtained using the same method as Example 2 by carrying out metal working without carrying out sputtering of silver, followed by observation of the physical properties and electromagnetic wave shielding properties thereof. The evaluation results are shown in the following Table 3.

Comparative Example 13

An electromagnetic shielding sheet was obtained by using the same single-layer non-woven fabric as Comparative Example 4 for the non-woven fabric according to the same method as Example 2 but carrying out metal working without carrying out sputtering of silver, followed by observation of the physical properties and electromagnetic wave shielding properties thereof. The evaluation results are shown in the following Table 3.

Comparative Examples 14 to 16

Single-layer non-woven fabrics were respectively obtained in Comparative Examples 14 and 15 having different fiber densities for only the non-woven fabric of the second layer among the layers of the laminated non-woven fabric used in Examples 3 and 11 for the non-woven fabric. Next, although metal working was attempted to be carried out by silver sputtering using the same method as Example 2, the non-woven fabric ended up tearing or shrinking during metal working, and favorable continuous electromagnetic shielding sheets were unable to be obtained. However, test pieces measuring 20 cm×20 cm were obtained in the laboratory by using the same metal deposition time only without applying tension to the non-woven fabrics. The shielding performance thereof is shown in the following Table 3.

In addition, a heat-set non-woven fabric was obtained by fixing the same non-woven fabric as Example 7 to a constant length and width (Comparative Example 16). Next, although metal working was attempted to be carried out by silver sputtering using the same method as Example 2, the non-woven fabric ended up tearing, although not shrinking, during metal working, and a favorable continuous electromagnetic shielding sheet was unable to be obtained. However, a test piece measuring 20 cm×20 cm was obtained in the laboratory by using the same time setting for the plating time only without applying tension to the non-woven fabric. The shielding performance thereof is shown in the following Table 3.

Comparative Examples 17 and 18

Coated sheets were obtained having smaller amounts of coated metal by using the same laminated non-woven fabric as Example 3 for the non-woven fabric, carrying out silver sputtering in the same manner as Example 2 and adjusting the duration thereof, followed by observation of the physical properties and electromagnetic wave shielding properties thereof. The evaluation results are shown in the following Table 3.

TABLE 3

| Comp Ex. | Configuration | Layer | Weight per unit area g/m² | Material | Avg. fiber diam. μm | Thickness μm | Ultrafine fiber content % | Ultrafine fiber layer surface area ratio % | Bulk density g/cm³ | Air flow resistance kPa·s/m | Flow average pore size μm | Tensile strength N | Tensile elongation % |
|---|---|---|---|---|---|---|---|---|---|---|---|---|---|
| 1 | 1 layer | 1 | 20 | PET | 12 | 89 | — | — | 0.23 | 0.04 | 45 | 55 | 15 |
| 2 | 1 layer | 1 | 20 | PET | 12 | 89 | — | — | 0.23 | 0.04 | 45 | 55 | 15 |
| 3 | 1 layer | 1 | 25 | PET | 18 | 115 | — | — | 0.22 | 0.06 | 50 | 59 | 15 |
| 4 | 1 layer | 1 | 20 | PET | 12 | 89 | — | — | 0.22 | 0.04 | 45 | 55 | 15 |
| 5 | 1 layer | 1 | 20 | PET | 9 | 90 | — | — | 0.22 | 0.05 | 30 | 53 | 15 |
| 6 | 1 layer | 1 | 20 | PET | 16 | 100 | — | — | 0.20 | 0.03 | 50 | 58 | 15 |
| 7 | 1 layer | 1 | 20 | PET | 1.6 | 90 | 100 | | 0.22 | 10 | 4 | 9.5 | 9.5 |
| 8 | 1 layer | 1 | 20 | PET | 0.3 | 80 | 100 | | 0.25 | 15 | 1 | 10.1 | 10.2 |
| 9 | 1 layer | 1 | 20 | PET | 1.6 | 90 | 100 | | 0.22 | 10 | 4 | 8.9 | 2.9 |
| 10 | 3 layers | 1 | 8.3 | PET | 12 | 31.3 | 17 | 20 | 0.64 | 0.4 | 10 | 65 | 20 |
| | | 2 | 3.4 | | 1.6 | | | | | | | | |
| | | 3 | 8.3 | | 13 | | | | | | | | |
| 11 | 3 layers | 1 | 8.3 | PET | 12 | 31.3 | 17 | 20 | 0.64 | 0.4 | 10 | 65 | 20 |
| | | 2 | 3.4 | | 1.6 | | | | | | | | |
| | | 3 | 8.3 | | 13 | | | | | | | | |
| 12 | 1 layer | 1 | 25 | PET | 18 | 115 | — | — | 0.22 | 0.06 | 50 | 59 | 15 |
| 13 | 1 layer | 1 | 20 | PET | 12 | 89 | — | — | 0.22 | 0.04 | 45 | 55 | 15 |
| 14 | 1 layer | 1 | 20 | PET | 1.6 | 90 | 100 | | 0.22 | 10 | 4 | 9.5 | 9.5 |
| 15 | 1 layer | 1 | 20 | PET | 0.3 | 80 | 100 | | 0.25 | 15 | 1 | 10.1 | 10.2 |
| 16 | 1 layer | 1 | 20 | PET | 1.6 | 90 | 100 | | 0.22 | 10 | 4 | 8.9 | 2.9 |
| 17 | 3 layers | 1 | 8.3 | PET | 12 | 31.3 | 17 | 20 | 0.64 | 0.4 | 10 | 65 | 20 |
| | | 2 | 3.4 | | 1.6 | | | | | | | | |
| | | 3 | 8.3 | | 13 | | | | | | | | |
| 18 | 3 layers | 1 | 8.3 | PET | 12 | 31.3 | 17 | 20 | 0.64 | 0.4 | 10 | 65 | 20 |
| | | 2 | 3.4 | | 1.6 | | | | | | | | |
| | | 3 | 8.3 | | 13 | | | | | | | | |

TABLE 3-continued

| | | Metal Working | | | | | Shielding Performance | | |
| --- | --- | --- | --- | --- | --- | --- | --- | --- | --- |
| | | Metal adhered | Coated | | | | EM wave shielding properties | | Surface |
| Plating method | Metal species | quantity g/cm³ | thickness μm | Adhered metal appearance | Metal adhesion | Processability | 100 MHz (dB) | 1 GHz (dB) | resistivity log Ω/☐ |
| Plating | Copper, nickel | 8 | 3 | C | C | B | 50 | 45 | 0.7 |
| Same as above | Same as above | 4 | 2 | C | C | B | 30 | 17 | −0.3 |
| Same as above | Same as above | 7 | 3 | C | C | B | 42 | 21 | −0.4 |
| Same as above | Same as above | 5 | 2 | C | B | B | 31 | 18 | 1.1 |
| Same as above | Same as above | 5 | 2 | B | B | B | 38 | 20 | 0.2 |
| Same as above | Same as above | 5 | 2 | B | B | B | 28 | 16 | 1.3 |
| Same as above | Same as above | 12 | 4 | A | C | C | 57 | 60 | −0.9 |
| Same as above | Same as above | 9 | 4 | B | C | C | 68 | 70 | −1.9 |
| Same as above | Same as above | 15 | 6 | A | C | C | 65 | 68 | −1.5 |
| Same as above | Same as above | 9 | 4 | A | A | A | 50 | 43 | 0.8 |
| Same as above | Same as above | 8 | 3 | A | A | A | 48 | 41 | 0.9 |
| Sputtering | Silver | 4 | 2 | C | B | A | 25 | 12 | 2.0 |
| Sputtering | Silver | 3 | 2 | B | B | A | 20 | 7 | 2.3 |
| Sputtering | Silver | 3 | 2 | C | AC | C | 41 | 31 | −0.4 |
| Sputtering | Silver | 3 | 2 | B | C | C | 50 | 41 | −0.9 |
| Sputtering | Silver | 4 | 2 | B | C | C | 52 | 41 | −1.0 |
| Sputtering | Silver | 2 | 1 | A | A | A | 37 | 21 | 0.2 |
| Sputtering | Silver | 1 | 1 | A | A | A | 24 | 8 | 1.9 |

INDUSTRIAL APPLICABILITY

Since the electromagnetic shielding sheet of the present invention is an electromagnetic shielding sheet composed of a non-woven fabric that demonstrates high electromagnetic wave shielding effects despite having small amount of coated metal, there is little increase in the base thickness following formation of a coating film, enabling it to be preferably used as a thin, electromagnetic shielding sheet in electronic devices. In addition, despite its reduced thickness, the electromagnetic shielding sheet of the present allows the obtaining of higher electromagnetic wave shielding effects and is able to be easily installed in an electronic device and the like due to its flexibility. In addition, due to its high strength, a metal-coated sheet can be obtained with higher efficiency, thereby making it possible to provide a high-performance electromagnetic shielding sheet at low cost.

The invention claimed is:

1. An electromagnetic shielding sheet composed of a laminated non-woven fabric having a first layer, a second layer, and a third layer, wherein the first layer and the third layer are a thermoplastic synthetic fiber layer having a fiber diameter of 6 μm to 50 μm, the second layer is an ultrafine fiber layer having a fiber diameter of 0.1 μm to 5.0 μm, and a metal is adhered to at least one side of the sheet as a continuous layer, wherein the thickness of the laminated non-woven fabric is 10 μm to 100 μm, and wherein a percentage of exposed surface area on the surface of the ultrafine fiber layer is 5% or more.

2. The electromagnetic shielding sheet according to claim 1, wherein the metal is adhered by electroless plating or sputtering.

3. The electromagnetic shielding sheet according to claim 1, wherein the tensile strength of the non-woven fabric is 20 N/3 cm or more.

4. The electromagnetic shielding sheet according to claim 1, wherein the content of the ultrafine fibers based on the total weight of the non-woven fabric is 12% by weight to 23% by weight.

5. The electromagnetic shielding sheet according to claim 1, wherein the bulk density of the laminated non-woven fabric is 0.3 g/cm³ to 0.8 g/cm³.

6. The electromagnetic shielding sheet according to claim 1, wherein the laminated non-woven fabric is obtained by a calendaring treatment.

7. The electromagnetic shielding sheet according to claim 1, wherein the surface resistivity of the sheet is a common logarithmic values of −2.0 Ω/☐ to −0.2 Ω/☐.

* * * * *